United States Patent [19]

Smith et al.

[11] Patent Number: 5,030,112

[45] Date of Patent: Jul. 9, 1991

[54] PLASTIC LEADED CHIP CARRIER CONNECTORS

[75] Inventors: Donald A. Smith; William H. Carter, both of Union City; Howard E. Dingfelder, Corry; Dale L. Burgess, Union City; Alan B. Gates, Corry, all of Pa.

[73] Assignee: Barnes Group, Inc., Bristol, Conn.

[21] Appl. No.: 488,356

[22] Filed: Mar. 2, 1990

Related U.S. Application Data

[62] Division of Ser. No. 383,464, Sep. 5, 1989, Pat. No. 4,928,378, which is a division of Ser. No. 230,810, Aug. 10, 1988, Pat. No. 4,879,808.

[51] Int. Cl.⁵ ............................................ H01R 23/72
[52] U.S. Cl. ...................................... 439/71; 439/747
[58] Field of Search ..................................... 439/68–73, 439/82, 83, 84, 744–748, 872, 741, 636, 637, 751, 733, 869, 873; 29/844, 845, 739

[56] References Cited

U.S. PATENT DOCUMENTS

| | | | |
|---|---|---|---|
| 2,882,512 | 4/1959 | Morone, Jr. | 439/747 |
| 3,196,377 | 7/1965 | Minich | 439/747 |
| 4,206,964 | 6/1980 | Olsson | 439/873 |
| 4,575,167 | 3/1986 | Minter | 439/751 |
| 4,729,739 | 3/1988 | Coffee et al. | 439/862 |

FOREIGN PATENT DOCUMENTS 1309172 10/1962 France ............................ 439/746

Primary Examiner—Neil Abrams
Attorney, Agent, or Firm—Pennie & Edmonds

[57] ABSTRACT

A plastic leaded chip carrier connector of a base having a plurality of apertures for receiving and orienting a plurality of wire pins therein, and a plurality of wire pins each of a predetermined configuration lockingly engaged within a corresponding aperture of the base for transmitting electrical information therethrough. The wire pins, which are of circular cross section are formed to have a generally U-shaped portion which permits the pins to be held in place in the electrical insulating body of the chip carrier in a snap-locking manner.

18 Claims, 10 Drawing Sheets

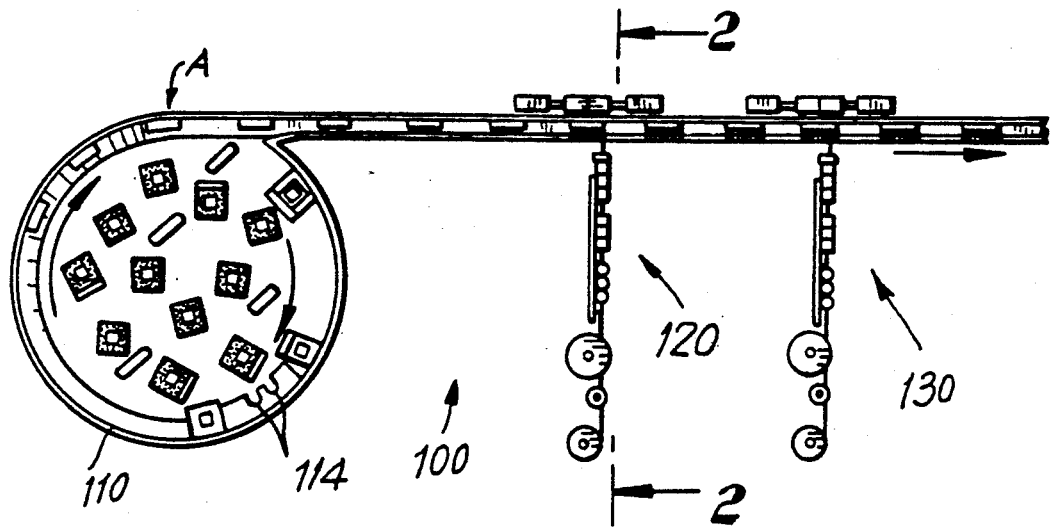
FIG. 1
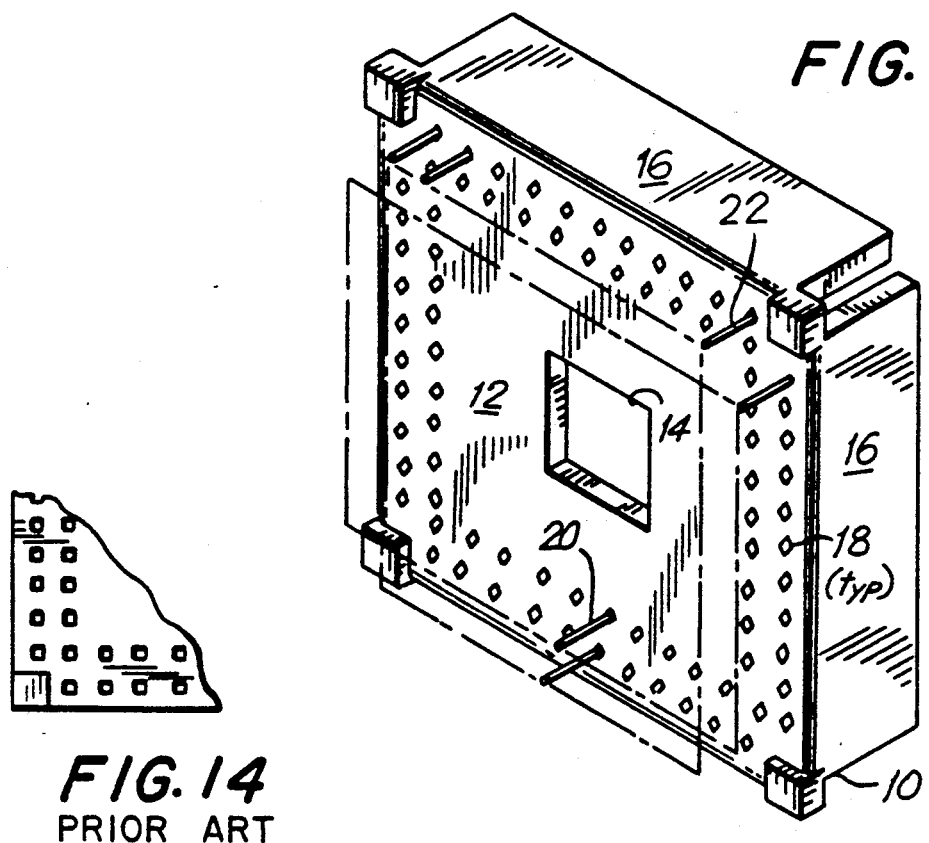
FIG. 13
FIG. 14
PRIOR ART

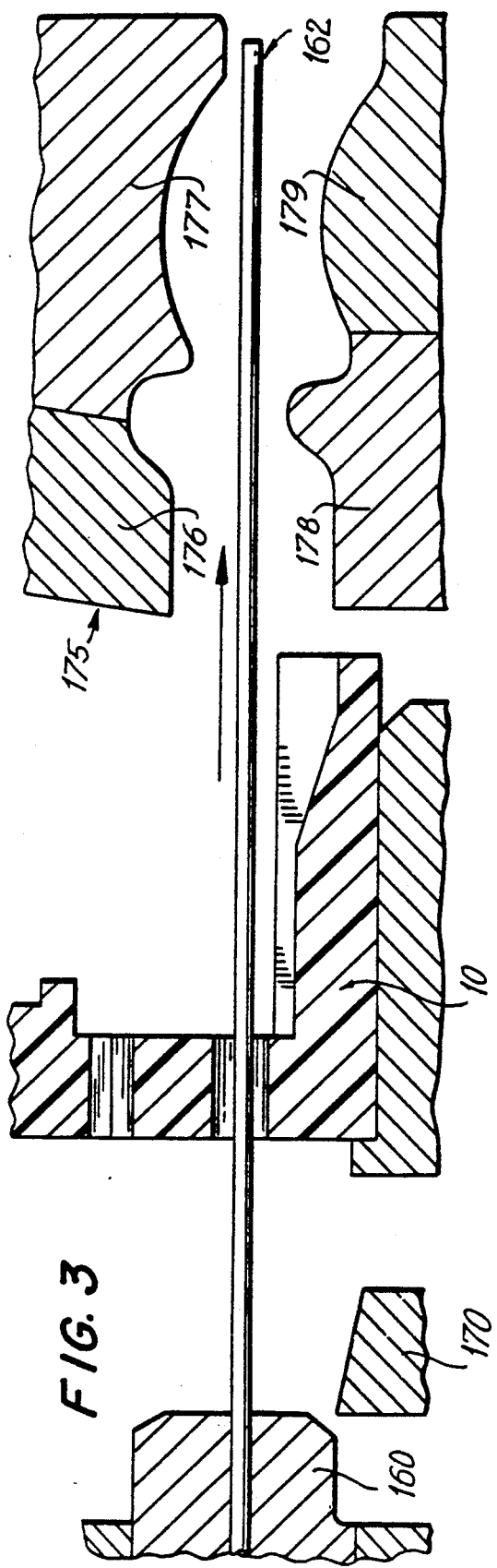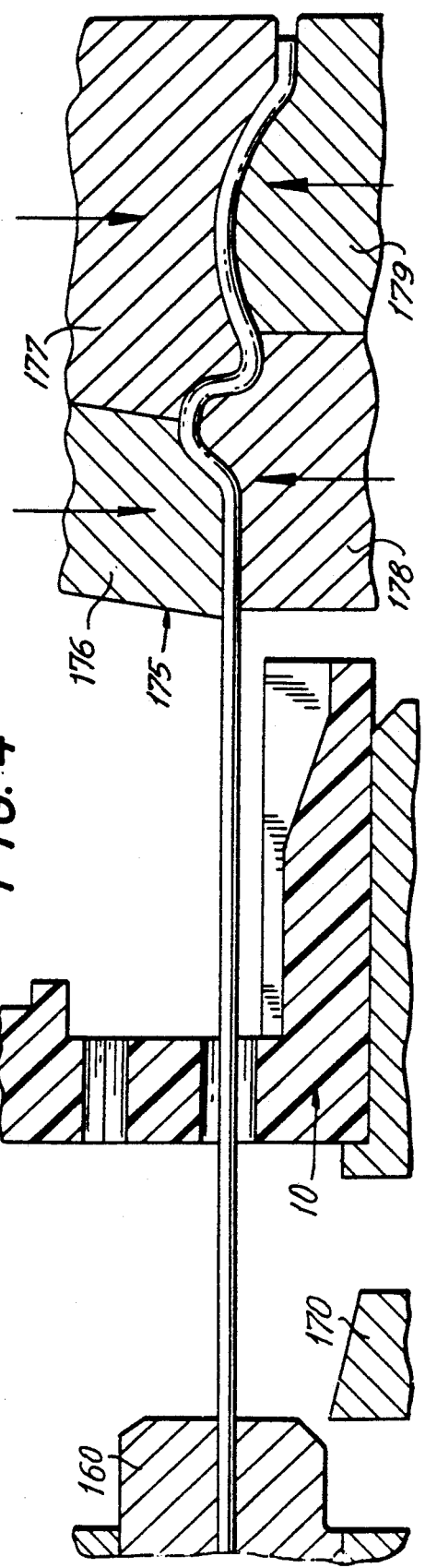

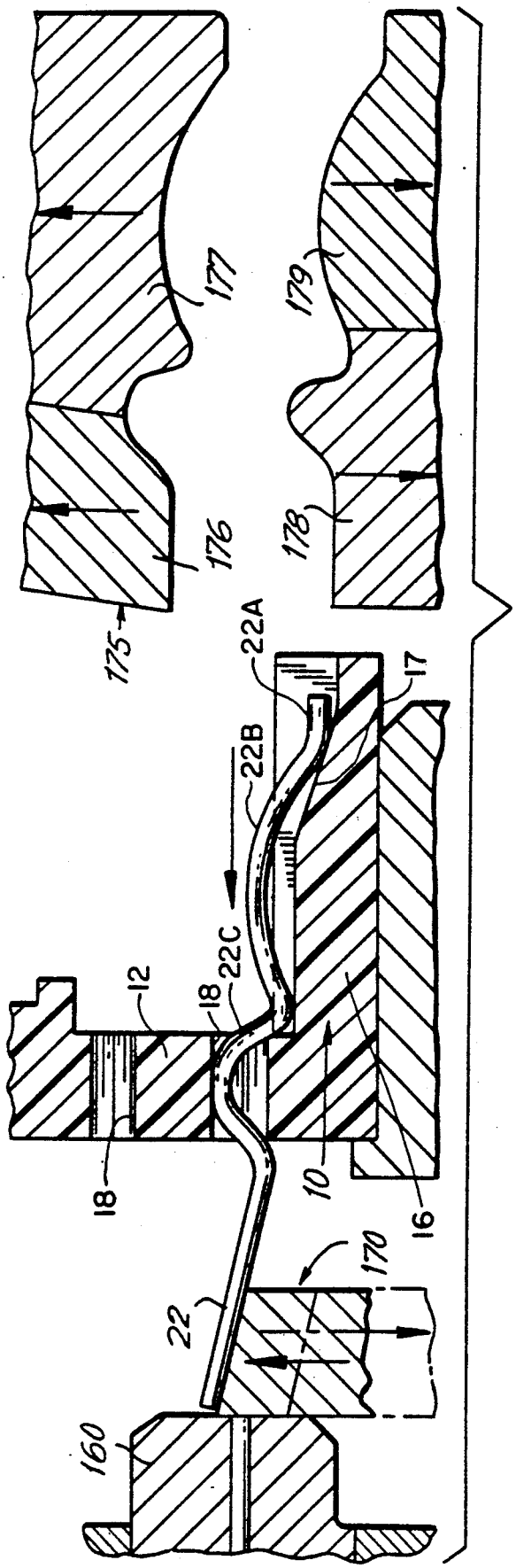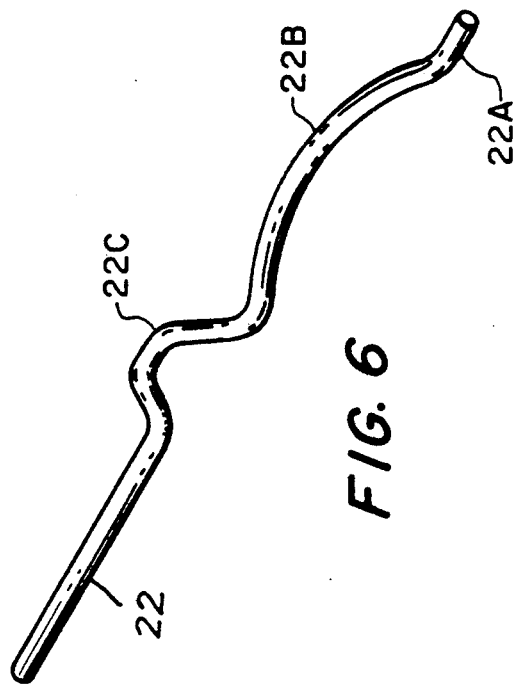
FIG. 5
FIG. 6

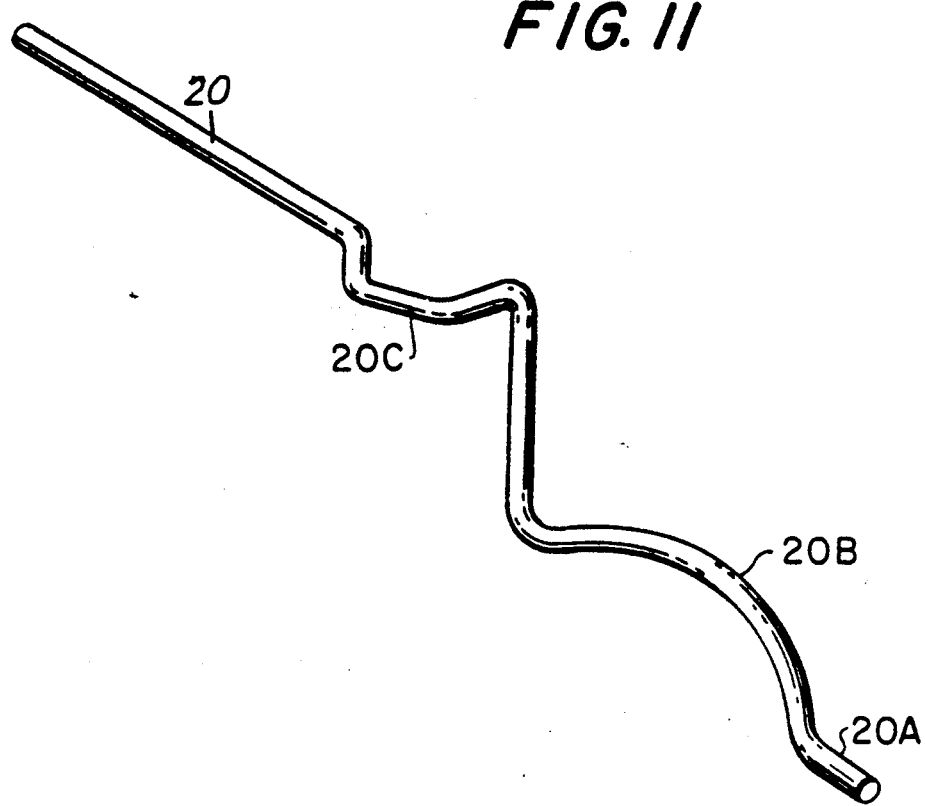
FIG. 11
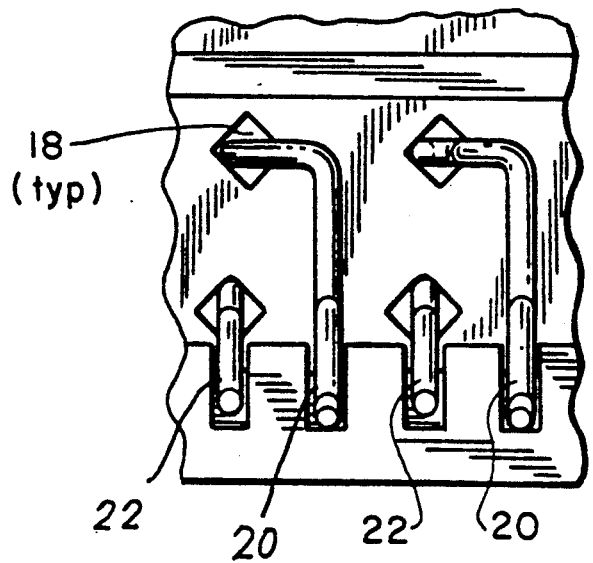
FIG. 12
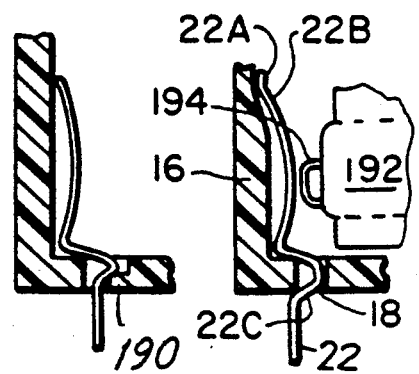
FIG. 15 PRIOR ART
FIG. 16

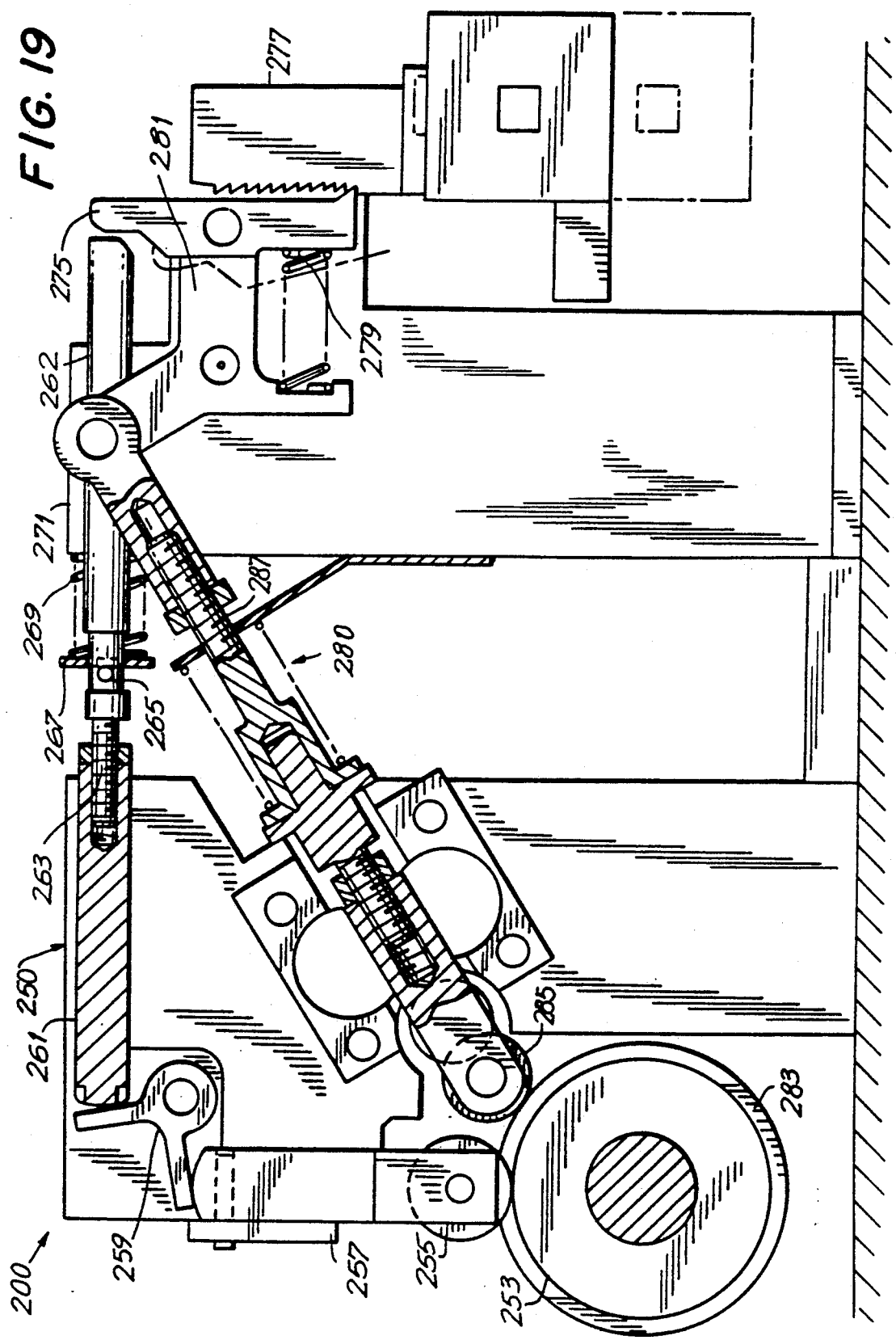

PLASTIC LEADED CHIP CARRIER CONNECTORS

This application is a division of application Ser. No. 07/383,464 filed Sept. 5, 1989, now U.S. Pat. No. 4,928,378, which is a division of application Ser. No. 07/230,810 filed Aug. 10, 1988, now U.S. Pat. No. 4,879,808.

TECHNICAL FIELD

This invention relates to a plastic leaded chip carrier connector having a plurality of rounded wire pins in a plastic housing or cube for holding and mounting integrated circuit chips onto printed circuit boards or the like. The invention also includes novel methods and apparatus for manufacturing such connectors in an efficient and precise manner.

BACKGROUND ART

Plastic leaded chip carrier ("PLCC") connectors which are known in the art include a plastic base having round, flat or rectangular pin contacts. A typical PLCC connector is described in U.S. Pat. No. 4,729,739. This patent discloses a connector for mounting and electrically connecting a chip carrier unit in an electrical circuit has a plurality of electrical contacts secured in openings in the bottom of an electrically insulating body to permit cantilever spring deflection of the contacts in accommodating a chip carrier unit within the connector between the contacts. The contacts comprise wire members of round cross section each having an opposite end bent to be slidable along a narrow line of engagement with an inclined ramp surface on an adjacent side wall of the connector body. Each contact has a bowed portion intermediate the contact ends which is bowed away from the adjacent ramp surface to slidbly engage terminals on the chip carrier unit as the unit is inserted into the connector. Engagement with the chip carrier terminals permits selected flattening of the bowed portions of the contacts and sliding of the opposite contact ends on the adjacent side wall ramp surfaces to provide simple beam spring deflection of the contacts in combination with the cantilever spring deflection, thereby to provide a force for resiliently engaging the chip carrier terminals.

According to conventional manufacturing techniques, a plurality of these pins are first made and then assembled into the plastic base in a predetermined pattern, usually in rows along each side on a peripheral portion thereof.

The plastic base and pins are separately manufactured and shipped to an assembly location, where an operator would manually insert each pin into each of the respective apertures in the base to form the PLCC connector. This manufacturing technique is unsatisfactory, since high production quantities could not be achieved at a reasonable cost.

A subsequent development includes the mounting of the formed pins onto a long brass strip, termed a "bandolier." This presents a continuously extending ordered array of pins which could be cut at predetermined intervals so that one entire side of the base, consisting of the desired number of pins (i.e., 6, 8, 9, 10, etc.), could be inserted in a single operation. This strip mounting process enables increased production to be achieved at lower cost. This bandolier operation represents a separate, additional manufacturing step which is undesirable, and does not enable precise tolerances to be met, thus requiring straightening and alignment of the pins after insertion.

SUMMARY OF THE INVENTION

The present invention relates to a method and apparatus for manufacturing PLCC connectors and to the novel connectors made thereby. Each aspect of the invention represents a significant improvement over previous products and manufacturing techniques. These improvements include:

1) a new pin configuration and base aperture design modification which enables the pins to snap or lock in place in the respective base apertures in an accurate, precise and reproducible manner heretofore not achieved by previous assemblies;
2) a new machine for continuously forming and inserting the pins into the apertures of the plastic base; and
3) a novel manufacturing process utilizing the new machine with additional components for making such plastic leaded chip carrier connectors in a more efficient manner which enables extremely high, increased production rates to be achieved.

The product has three inventive embodiments: the pins themselves are made in a manner so that they can lock or snap into an aperture in the base; the base itself has a square aperture for each pin, whereby each aperture is oriented 90° disposed from those of the prior art; and the overall connector assembly has a novel orientation of square apertures with pins locked therein. Thus, the pins are locked in the aperture and are each maintained in a precise location, so that straightening or reorientation of the pins after assembly is unnecessary.

The second embodiment of the invention, the new machine, enables the simultaneous forming and insertion of the wire pins into the base. At one end of the machine, a spool of wire provides an essentially continuous supply of wire, e.g., enough for one day's operation. The leading end of the wire passes through a block which straightens the wire, and then is grasped by jaws for advancing the wire forward. The forward end of the wire is advanced into and through an aperture in the base, and thereafter into a forming tool which forms the wire into the desired shape and configuration for the pin. Since the advancing jaws still hold the rearward end of the formed wire, it then retracts the wire to snap the pin into the correct position in the respective base aperture. Thereafter, the rearward end of the pin is cut, the base is indexed to the next aperture, and the wire is advanced, formed, retracted, positioned and cut as previously described. When a square or rectangular base is used, the indexing mechanism allows the wire pins to be inserted along one edge of the base, while thereafter, a pivot arm can be used to rotate the cube 90° so that pins may be inserted along a second side. After two further rotations by the pivot arm, the entire periphery of the square or rectangular base is provided with wire pins. A round base can also be utilized, with the indexing mechanism rotating the base through the appropriate anagle to position the adjacent aperture with respect to the wire.

A particular PLCC connector of interest includes two rows of pins: an outer row and an inner row. Two wire inserting modules are required on the machine: one to insert the outer pins and one to insert the inner pins. Each module works in the same manner described above, but two are needed because of the difference in position and pin form of the inner and outer rows on the base.

Finally, the novel sequence of processing steps form a third embodiment of the invention. As noted above, the prior art does not simultaneously form and insert a pin into an aperture of the base while automatically and sequentially repeating this step for adjacent apertures.

BRIEF DESCRIPTION OF THE DRAWINGS

Preferred embodiments of the invention are described hereinbelow with reference to the drawing figures wherein:

FIG. 1 is a top plan view of a vibrating bowl feeder for the plastic bases and inner and outer wire feed devices according to the invention;

FIG. 3 is a side view partially in cross section of the inner wire feed device of FIG. 1 illustrating the wire end passing through a base and into the outer pin forming mold;

FIG. 4 is a side view similar to FIG. 3 with the outer pin forming mold engaging the wire end;

FIG. 5 is a side view of the formed outer pin retracted into position in the base;

FIG. 6 is a perspective view of the formed outer pin;

FIG. 11 is a perspective view of the formed inner pin:

FIG. 12 is an enlarged top view of the base illustrating the position of the inner and outer pins therein;

FIG. 13 is a perspective view of the final plastic leaded chip carrier connector according to the invention;

FIG. 14 is a partial top corner view of a plastic base according to the prior art;

FIG. 15 is a side view partially in cross section of an outer/pin in position in the base of FIG. 14;

FIG. 16 is a side view partially in cross section of an outer pin in position in the base of FIG. 13;

FIG. 19 is a side view of an indexing mechanism for placement of the plastic bases into alignment with the wire feed device and pin forming mold.

DETAILED DESCRIPTION OF THE PREFERRED EMBODIMENTS

Figure 2:
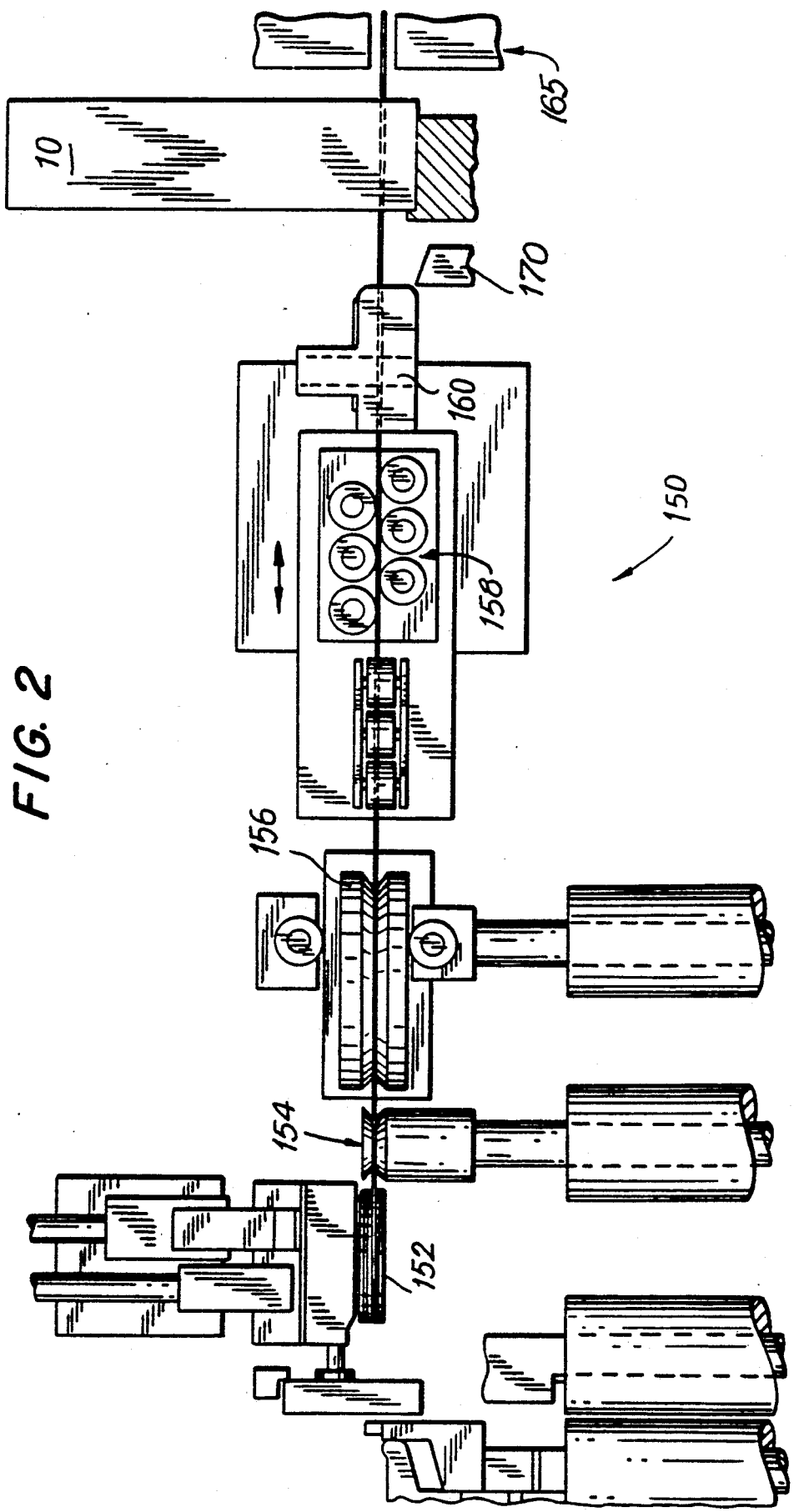
FIG. 2 is an enlarged top plan view of one of the wire feed devices of FIG. 1.

The invention will now be described with respect to the manufacture of the most preferred embodiment, a PLCC connector having square plastic base having two spaced rows of pins around its periphery. U.S. Pat. No. 4,729,739 discloses an earlier version of such PLCC connector and, to the extent that similar features are disclosed, the content of this patent is expressly incorporated herein by reference thereto.

This plastic base is generally referred to as a cube. As best illustrated in FIG. 13, the cube 10 has an alignment aperture 14 in a generally flat bottom portion 12, with four walls 16 extending perpendicular to the bottom portion so as to form the four sides of the cube. These cubes are usually of molded plastic construction. An inner and outer row of spaced square apertures 18 are provided for reception of the inner pins 20 and outer pins 22, respectively. These square apertures are oriented with their corners pointing toward the side walls 16 of the cube 10 assist in aligning the pins in the proper position in the cube. The pins which extend from the bottom portion 12 plug into an electrical device and transmit electrical signals from the device, through the cube and into an integrated circuit chip which is carried therein shown in FIG. 16.

Figure 10:
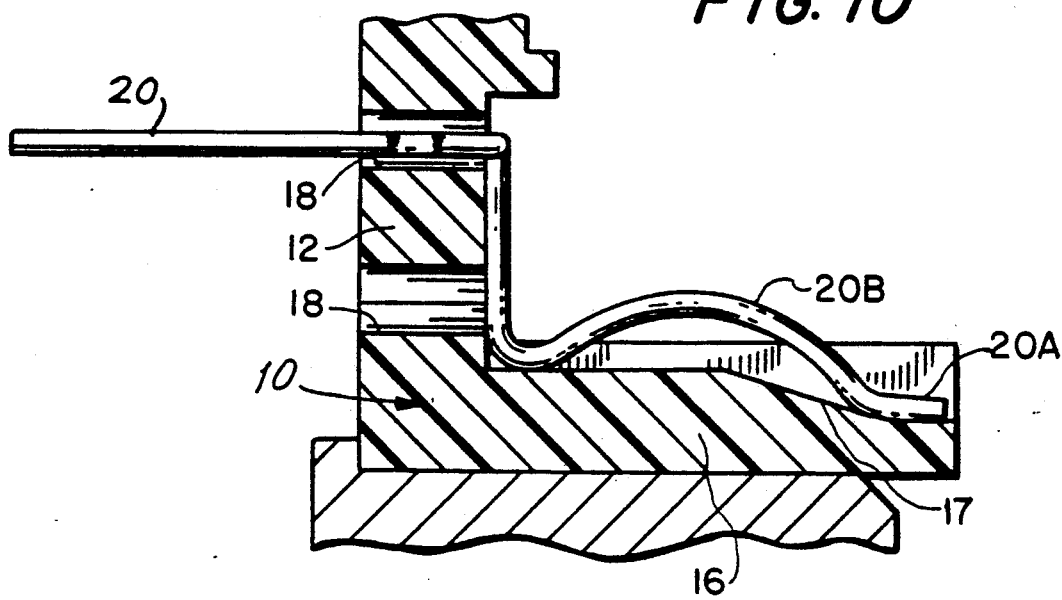
FIG. 10 is a side view of the formed inner pin retracted into position in the base.

As noted above, connector 10 preferably has an electrically insulating body having a bottom portion 12, at least one side wall 16 upstanding from the bottom portion, a plurality of openings 18 spaced in the bottom portion around a common axis; and a plurality of resilient, electrically conductive contacts disposed in respective body openings to resiliently engage terminal means on opposite sides of a chip carrier unit 192 inserted into the connector along the common axis. The common axis passes through the center of alignment aperture 14. The connector body has ramp surfaces 17, as shown in FIGS. 5 and 10, on the side walls facing the common axis and inclined relative to the common axis to face away from the bottom portion 12 of the body. The contacts comprise wire members or pins 20, 22 of substantially round cross section each having one end secured in a respective body opening 18 to permit relatively low force cantilever spring deflection of the contacts for accommodating the chip carrier unit 192 therebetween. Each contact 20, 22 has a first bent portion 20A, 22A of the round wire cross section at an opposite end slidable along a narrow line of engagement with an adjacent side wall ramp surface extending along the direction of incline in the ramp surface, and a bowed portion 20B, 22B of the round wire cross section intermediate the contact ends bowed away from the adjacent side wall ramp surface to slidably engage the terminal means on the chip carrier unit 192 along a narrow line of engagement extending in the direction of insertion of the chip carrier unit into the connector to permit selected flattening of the bowed contact portion. The sliding of the contact end 20A, 22A on the adjacent side wall ramp surface 17 provides simple beam spring deflection of the contact with relatively greater force to resiliently engage the terminal means with more precisely predetermined contact forces. Also, each of said contacts include a second bent portion 20C, 22C, preferably of a loop, for lockingly engaging its respective opening in said bottom portion and for attaching and positioning the contact in the aperture or opening 18 of the bottom portion at a predetermined orientation.

The diameter of the round wires in each contact is proportioned relative to the inclination of the side wall ramp surfaces 17 to require at least ten times greater force per unit deflection for the simple beam spring deflection than for the cantilever spring deflection. Also, the bottom portion of the body has orientation slots therein having selected dispositions relative to the respective body openings. The contacts 20, 22 have other, round wire, portions thereof located intermediate these additional portions and the contact ends 20A, 22A are accommodated in respective orientation slots for arranging round wire cross section bowed portions 20B, 22B of the contacts with predetermined orientations relative to the common axis and to the adjacent side wall ramp surfaces 17. At least some of the contact orientation means is of a loop configuration aperture 18. For greater attachment forces, an adhesive means may be used to secure the contact orientation portions 20C, 22C in the body openings 18 as well as to seal the body openings 18.

Advantageously, the body openings 18 are arranged in a pair of inner and outer rows extending along the body side walls 16 with a selected spacing between the openings in each row. The side wall slots are arranged with half the selected space therebetween. Contacts 20 in a first group thereof have one contact end secured in the respective body opening 18 in the inner contact row to extend from the body through the openings, and have orientation portions thereof angularly disposed in the plane of the body bottom with the opposite contact ends 20A slidable on ramp surfaces 17 in respective alternate side wall slots which are offset from the respective body openings 18. The contacts 22 in a second group thereof have one contact end secured in the respective body opening 18 in the outer contact row to extend from the body through the openings. These contacts 22 have loop shaped orientation portions 22C disposed in the plane of the respective bowed contact portions 22B with the opposite contact ends 22A slidable on ramp surfaces 17 in the respective other side wall slots. The connector body preferably has the apertures 18 disposed to receive the loop-shaped orientation portions 20C, 22C of the contacts in a snap-locking manner therein, thereby providing the contact ends 20A, 22A with the selected spacing extending from the body to be connected in an electrical circuit, while permitting the contacts 20, 22 to engage terminal means 194 on the chip carrier unit 192 with half the selected spacing. These openings 18 are preferably polygonal in shape with a point of the polygon perpendicularly facing a side wall 16 of the bottom portion 12.

FIG. 1 illustrates the overall arrangement of manufacturing system 100 according to the invention. A supply of cubes is placed into a vibrating bowl 110 which has a helically extending track 112 for delivery and orientation of the cubes 10 for subsequent operations. As the bowl and track vibrate, the cubes first move to the outer periphery of the bowl and then upwardly along the track. The width of the track is less than the width of the cube and is generally about ⅔ the width of the cube. Return means, in the form of a dual notch or slot 114, is provided in the track 112 to assure that the cubes are removed from the bowl 110 with their walls 16 extending upwardly. Cubes which begin moving upwardly along the track 112 with their wall sides down encounter the notches 114 whereby the weight of the cube in combination with the open spaces of the notch cause the cube to fall back into the bowl. Those cubes moving along the track with their flat bottom portions in direct contact with the track are able to slide across these notches without being returned to the bowl. Thus, each cube is properly oriented in position for further processing.

As the cubes exit the bowl at point A, the track bends so as to orient the cube in a "standing" position on one of its walls 16. Then, these cubes continue along the track and into an inner pin forming and inserting station 120, whereby inner pins are placed in the inner row of cube apertures. After the inner pin placement is completed, the cubes continue on to an outer pin forming and inserting station 130, for placement of the outer pins in the outer row of apertures in the cube. After all pins are placed, the PLCC connector illustrated in FIG. 13 is obtained.

FIG. 2 is a detail of the wire feed advancing system 150 used in both the inner and outer pin forming and inserting stations 120, 130. A supply of wire, preferably from a spool 152, passes over an idler pulley 154 and into a pair of blocks 156 which apply force to the end of the wire to straighten it before being formed and inserted into the base. The wire is moved forward by a second pair of blocks 158 which grasp the wire and then move it forward a desired length. As it moves forward, the wire passes through an aperture in an alignment block 160 which aligns and directs the wire through an aperture in the cube. The end 162 of the wire passes through the cube and into a pin forming mold 165. After the mold forms the desired pin configuration, the advancing blocks 158 retract the pin to insert it into the cube 10. Finally, a blade 170 cuts the wire to the desired length to complete the formation of the pin. An indexing mechanism then positions an adjacent aperture for reception of a pin in the same manner. The entire sequence for forming and inserting the pin into the cube is as follows:

1) a cube aperture positioned in alignment with the wire end;
2) blocks 158 contact the wire and advance the wire end through the cube aperture end into an open pin forming mold;
3) the two halves of the pin forming mold close to form the configuration of the pin;
4) the blocks 158 retract the formed pin into the cube where it snaps into the correct position;
5) cutting blade 170 separates the formed pin from the wire supply;
6) blocks 158 open and move toward the supply, while blocks 156 contact the wire to straighten it;
7) blocks 156 open while blocks 158 contact the wire;
8) an indexing mechanism adjusts the position of the cube so that the next adjacent aperture is aligned with the wire feed system; and
9) steps 1) to 8) are repeated as often as necessary to complete the placement of the array of pins in the cube.

FIGS. 3–5 illustrate the outer pin forming mold and the sequence of steps which occur in the forming of the outer pin 22. A perspective view of the final outer pin 22 is illustrated in FIG. 6.

FIG. 3 shows the forward end 162 of the wire extending from the alignment block past cutting blade 170, through cube 10 and into mold 175. The mold 175 is formed by discrete mold members 176, 177, 178 and 179 which form the various configurations and changes of direction on the forward end 162 of the wire by a forming operation when the mold members 176, 177, 178 and 179 are brought together, as shown in FIG. 4.

The remaining outer pin formation steps are illustrated in FIG. 5. After forming the pin, the mold members are moved apart, the pin is snapped into the cube aperture, and the cutting blade 170 trims the pin 22 to its proper length wherein the smaller bent portion of the pin enables it to be firmly locked in place in the cube.

Figure 7:
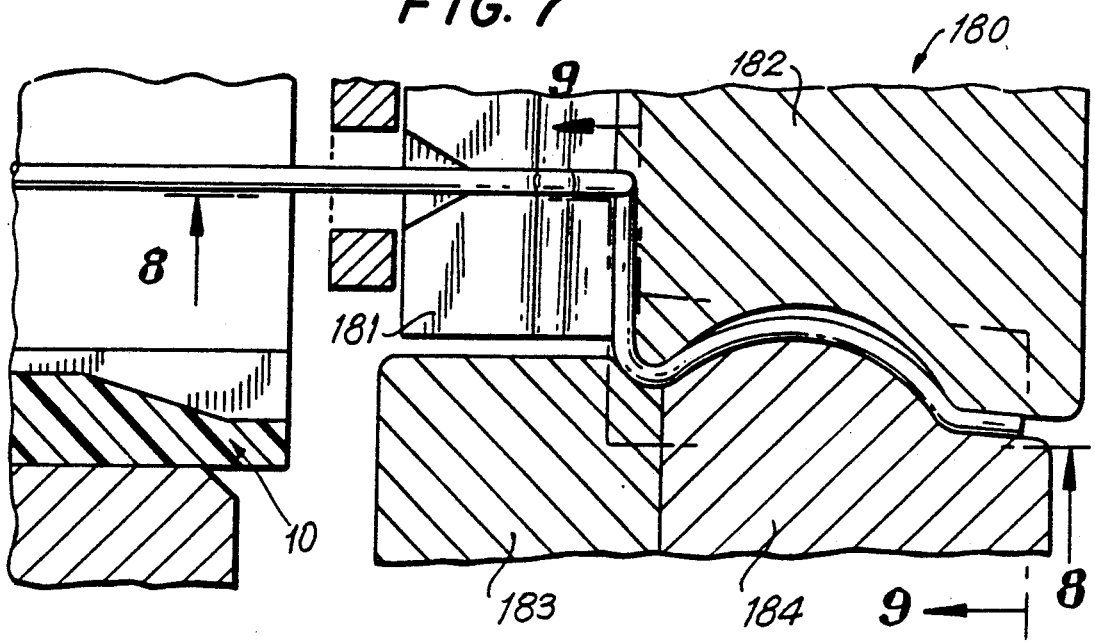
FIG. 7 is a side view partially in cross section similar to FIG. 4 illustrating the inner pin forming mold engaging a wire end.
Figure 8:
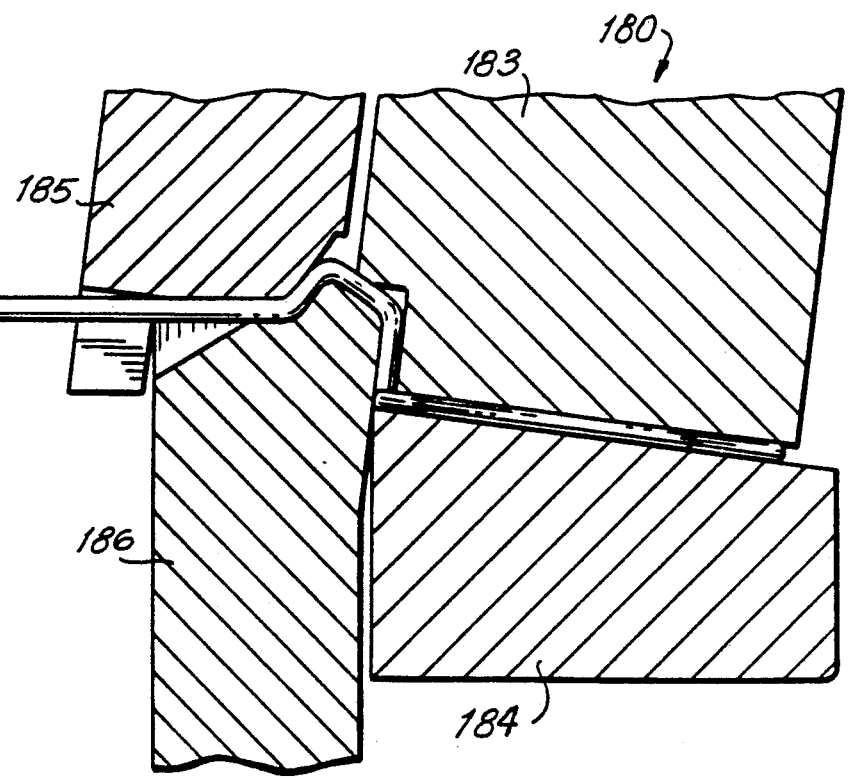
FIG. 8 is an enlarged side view of the inner pin forming mold of FIG. 7.
Figure 9:
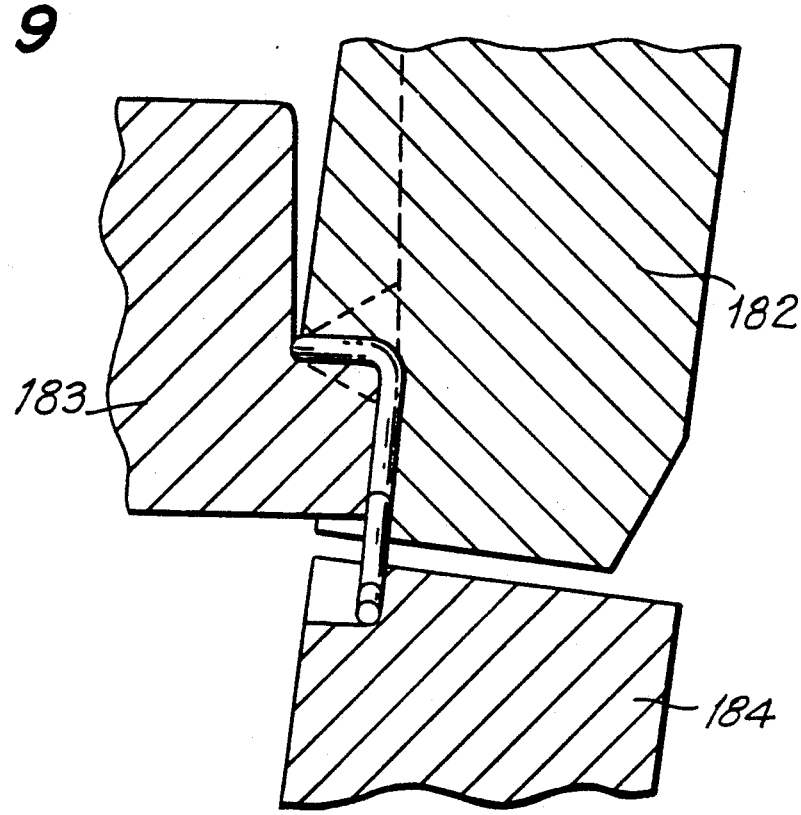
FIG. 9 is an enlarged end view of the inner pin forming mold of FIG. 7.

The procedure for forming the inner pin 20 is substantially the same as for the formation of the outer pin, except that a different forming mold 180 is used. FIGS. 7–9 illustrate the mold members 181 through 186 which are contacting the wire end to form the inner pin. FIG. 10 shows the inner pin 20 in place in the cube 10, while FIG. 11 is a perspective view of the inner pin 20 itself.

The wire used to form these pins is preferably an 0.013 inch diameter phosphor bronze.

FIG. 12 is an exploded view of a portion of the cube to illustrate the respective positions of the inner 20 and outer 22 pins when locked into the apertures of the cube 10. FIG. 15 illustrates the prior art arrangement for supporting the pins in the aperture. As illustrated, the cube base includes a step 190 upon which a bent portion of the pin rests and is supported. As noted above, however, such pins need to be straightened and aligned after being placed in that manner, since there is no reproducible method for placing the pins in the correct position at the correct orientation. FIG. 16 illustrates the locking engagement of the pins into the apertures 18 according to the invention.

FIG. 13 illustrates the final assembly of the PLCC connector, with pins 20, 22 locked into and extending from apertures 18 in base 12. As can be best seen by a comparison with FIG. 14, the apertures 18 are 90° disposed from those of the prior art, with a point of each of the square apertures pointing perpendicularly to a side wall 16 of the cube. As shown in FIG. 14, the prior art utilizes cubes having square apertures whereby one side of the aperture is parallel with the adjacent side wall of the cube. By rotating these apertures 90°, the present invention obtains a construction whereby the pins 20, 22 are locked in the apertures 18. This also enables the pins 20, 22 to be properly oriented within the cube so that no further straightening or alignment is necessary.

The pins and cubes of the present invention provide a highly improved placement assembly, in that the pins are repeatedly and precisely oriented by locking engagement with the cube apertures: as noted above, straightening and reorientation are avoided.

Figure 17:
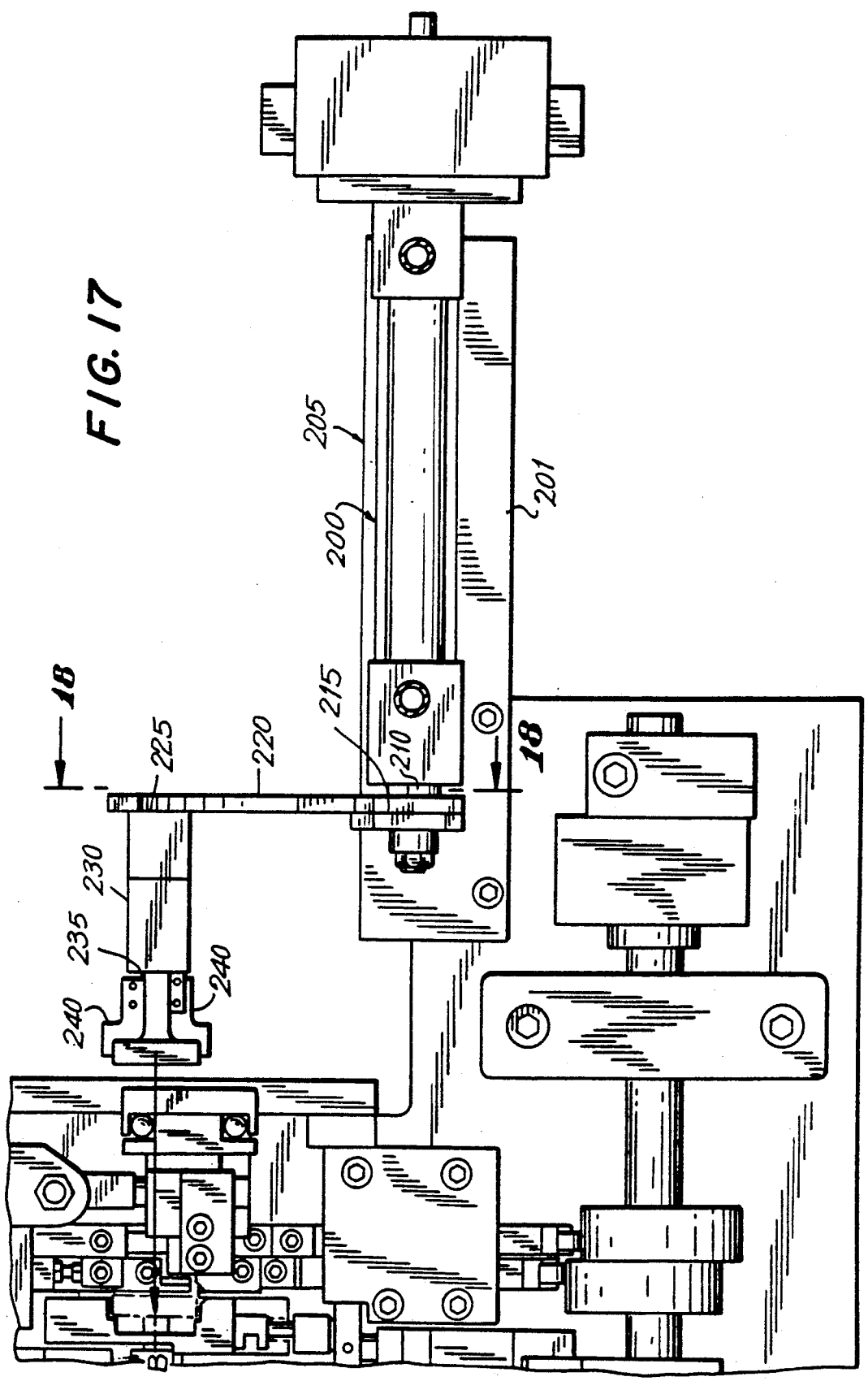
FIG. 17 is a top view of a plastic base rotator arm of the invention.
Figure 18:
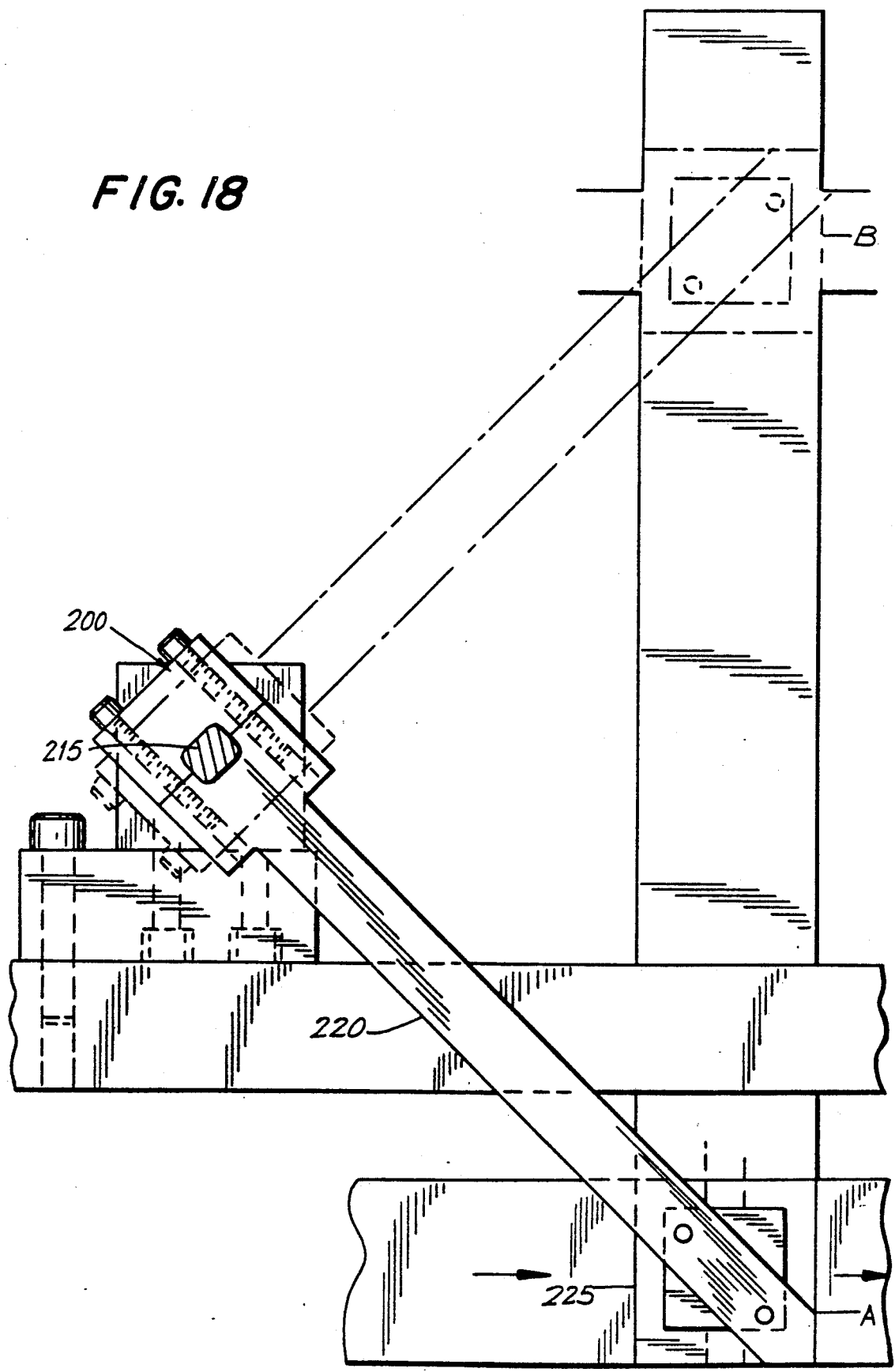
FIG. 18 is a side view of the rotator arm of FIG. 17.

FIGS. 17 and 18 depict a pick and place mechanism 200 designed to pick up a cube, rotate it 90° and place it at the top of the cube feeder track. The mechanism generally consists of a robotic manipulator using a cylindrical coordinate frame.

The base 201 of the manipulator is set firmly in place so that it cannot move with respect to the other machinery. Fixed to the base is an air cylinder 205, which is a long, hollow member housing a rod 210. The rod fits within the cylinder, moves axially outward from the cylinder, and rotates about its axis. The motion of the rod is controlled by pneumatic motors.

The arm 220 is attached at the forward tip 215 of the rod 210. The arm is a bar perpendicular to the axis of the rod, and extends radially outward from the rod axis. Attached to the forward end 225 of the arm 230 is a rectangular 230 bar extending forward from the arm, perpendicular to the length of the arm, and parallel to the rod. At the forward end 235 of this bar 230 are gripper fingers 240. These fingers extend forward from the bar 230, and open and close to grasp the cubes 10.

In the optimal situation, the feeder tract B is set above the output from the indexer (pick up location) A. The manipulator 200 is fixed so that when the rod is extended, forward tip 215 is located at the right angle of a right isosceles triangle with other vertices A and B and sides the length of the arm 220.

In operation, the manipulator is synchronized so that when a cube is outputted from the indexer, the manipulator is ready to pick it up. At this location A the rod 210 is extended, and rotated so that the arm 220 points 45 degrees downward from horizontal. The fingers 240 close around the cube, and the rod retracts. The rod 210 then rotates 90 degrees upward so that the arm 220 points 45 degrees above horizontal, and the cube has been rotated 90 degrees. The rod extends so the gripper fingers 240 reach the top of the feeder tract B, and then the fingers release the cube. Next, the rod retracts, rotates downward 90 degrees, and extends so it is ready to pick up another cube at the indexer output.

After all four sides of a cube have had wires inserted, the manipulator is programmed to not pick up the cube at the pick up site, but rather waits for a cube that is not completed.

Other types of pick and place mechanisms may also work suitably, but the optimal arrangement minimizes the number of pneumatic motors and programming steps that need to be employed to rotate and move the cubes through the system.

FIG. 19 depicts the indexing system of the invention. One indexing mechanism is driven by cam 253 and cam follower 255. A metal bar 257 attached to the cam follower contacts the lower branch of lever 259. The lever is "L" shaped, and hinged at the corner. The other branch of the lever contacts push rod 261. The push rod is adjustable by bolt 263. Pin 265 restricts the movement of washer 267. Spring 269 located between washer 267 and support 271, coils around push rod 262. Push rod 262 is attached to push rod 261 by bolt 263. Push rod 262 contacts pivot 275, which has a toe in contact with the teeth of rack 277. Spring 279, connected between the pivot 275 and mount 281, maintains the toe of the pivot 275 in proper position against the rack 277. This allows the pivot 275 to be retracted after one side of the cube has been provided with pins so that rack 277 can be returned to its starting position for operation on a subsequent cube.

A second indexing mechanism 280 in the form of an inclined arm 287 is utilized to operate the pivot 275 to allow the rack 277 to be moved downward. This mechanism 280 is driven by cam 283 and cam follower 285. An adjustable inclined metal arm 287 connects the cam follower 285 to an upper portion of mount 281. As the cam 283 rotates, the cam follower 285 causes arm 287 to move pivot 275, thus dropping the rack 277 a predetermined distance which corresponds to the spacing between the cube apertures.

In operation, the rack 277 engages a cube from the cube feeder tract. As the cam 283 rotates, the cam follower 285 contacts a displacement in the cam 283 and moves upward. Bar 287 pushes pivot 275, which causes the toe of the pivot to swing outward, allowing rack 277 to move down a notch. Release of the arm 287 causes the toe of pivot 275 to move back against the rack 277. The cube is thus in position for the next pin to be inserted, and the mechanism is reset. After all pins have been inserted in an entire side of a cube, the cube is released and the rack 277 is reset by another indexing mechanism beneath rack 277 (not shown) which returns the rack 277 to its original position for engaging another cube.

While it is apparent that the invention herein disclosed is well calculated to fulfill the objects above stated, it will be appreciated that numerous modifications and embodiments may be devised by those skilled in the art, and it is intended that the appended claims cover all such modifications and embodiments as fall within the true spirit and scope of the present invention.

What is claimed is:

1. A plastic leaded chip carrier connector comprising:
   a base having a plurality of apertures for receiving and orienting a plurality of wire pins therein; and a plurality of wire pins of circular cross section, each of a predetermined configuration and including means for snap locking engagement with a corresponding aperture of said base for attaching and positioning said pins in said apertures of said base at a predetermined orientation and configuration for transmitting electrical information through said base, wherein said snap locking engagement means of each said pin comprises a generally U-shaped section having said circular cross section, a top portion and a bottom portion and being adapted to provide snap-locking engagement in said corresponding aperture, said top portion engaging and exerting spring pressure on an upper surface of said corresponding aperture while said bottom portion engages and exerts spring pressure on a lower surface of said corresponding aperture; and wherein said predetermined orientation and configuration of said plurality of pins are adapted for resilient engagement with terminal means of a chip carrier unit which is placed upon said base.

2. The connector of claim 1 wherein said base is configured, to include a plurality of sides, each of which contains a plurality of said apertures in a predetermined pattern along each side.

3. The connector of claim 2 wherein said apertures are polygonal in shape with a point of the polygon perpendicularly facing a side of said base.

4. The connector of claim 3 wherein said apertures are square.

5. The connector of claim 2 wherein said base includes four sides, each of which includes a wall member extending perpendicular thereto.

6. The connector of claim 5 wherein each side of said base includes two spaced rows of square apertures, wherein a point of each square aperture perpendicularly faces the side of said base along which it is spaced in said row.

7. The connector of claim 2 further comprising an aperture to facilitate alignment and manufacture of said connector.

8. The connector of claim 1 further comprising an integrated circuit chip placed upon said base, wherein a plurality of said pins are electrically connected to said chip through said base for transmitting electrical signals between said chip and an electrical device.

9. A connector for mounting a chip carrier unit in an electronic circuit comprising an electrically insulating body having a bottom portion, at least one side wall upstanding from the bottom portion, and a plurality of openings, spaced in the bottom portion around a common axis; and a plurality of resilient, electrically conductive contacts disposed in respective body openings to resiliently engage terminal means on opposite sides of a chip carrier unit inserted into the connector along the common axis, the connector body having ramp surfaces on the side walls facing the common axis and inclined relative to the common axis to face away from the bottom portion wherein the contacts comprise wire members of substantially round cross section each having one end secured in a respective body opening to permit relatively low force cantilever spring deflection of the contacts for accommodating the chip carrier unit therebetween, each contact having a first bent portion of the round wire cross section at an opposite end slidable along a narrow line of engagement with an adjacent side wall ramp surface extending along the direction of incline of the ramp surface, wherein a bowed portion of the round wire cross section intermediate the contact ends is bowed away from the adjacent side wall ramp surface to slidably engage the terminal means on the chip carrier unit along a narrow line of engagement extending in the direction of insertion of the chip carrier unit into the connector to permit selected flattening of the bowed contact portion and of the opposite contact end on the adjacent side wall ramp surface for providing simple beam spring deflection of the contact with relatively much greater force to resiliently engage the terminal means with more precisely predetermined contact forces, and further wherein each of said contacts includes a second bent portion having means for lockingly engaging its respective opening in said bottom portion for attaching and positioning said contact in said aperture of said bottom portion at a predetermined orientation.

10. The connector according to claim 9 further characterized in that the contacts and diameters of the round wires in the contacts are proportioned relative to the inclination of the said side wall ramp surfaces to require at least ten times greater force per unit deflection for said simple beam spring deflection than for said cantilever spring deflection.

11. The connector according to claim 10 further characterized in that the bottom of the body has orientation slots therein having selected dispositions relative to the respective body openings, and the contacts have other, round wire, portions thereof located intermediate said additional portions and said one contact ends accommodated in respective orientation slots for arranging round wire cross section bowed portions of the contacts with predetermined orientations relative to said common axis and to said adjacent side wall ramp surfaces, at least some of said contact orientation portions comprising a loop configuration as the second bent portion.

12. The connector according to claim 11 further characterized in that adhesive means secure said contact orientation portions in said body orientation slots and seal said body openings.

13. The connector according to claim 12 further characterized in that said body openings are arranged in a pair of inner and outer rows extending along the body side walls with a selected spacing between the openings in each row, said side wall slots are arranged with half said selected space therebetween, contacts in a first group thereof have said one contact end secured in respective body openings in said inner contact row to extend from the body through said opening, have orientation portions thereof angularly disposed in the plane of the body bottom and have said opposite contact ends slidable on ramp surfaces in respective alternate side wall slots, offset from the respective body openings, and the contacts in a second group thereof have said one contact ends secured in respective body openings in said outer contact row to extend from the body through said openings, have said loop shaped orientation portions thereof disposed in the plane of the respective bowed contact portions and have said opposite contact ends slidable on ramp surfaces in respective other side wall slots, the connector body having said orientation slots disposed to receive said angularly disposed and said loop-shaped orientation portions of the contacts freely therein, thereby providing said one contact end with said selected spacing extending from the body to be connected in an electrical circuit while permitting the contacts to engage terminal means on the chip carrier unit with half said selected spacing.

14. The connector of claim 9 wherein the openings in said body are polygonal in shape with a point of the polygon perpendicularly facing a side wall of said bottom portion.

15. A plastic leaded chip carrier connector comprising:
- a base having a generally flat bottom portion and four sides, each of which includes a wall member extending perpendicular thereto, wherein along each side of said base parallel to said wall member are two spaced rows of square apertures for receiving and orienting a plurality of pins therein, wherein a point of each square aperture perpendicularly faces the side of the base along which it is spaced in said row; and
- a plurality of wire pins of circular cross section, each of a predetermined configuration and including means for snap-locking engagement with a corresponding aperture of said base for attaching and positioning said pins in said apertures of said base at a predetermined orientation for transmitting electrical information through said base;
- wherein said snap locking engagement means of each said pin comprises a generally U-shaped section having said circular cross section, a top portion and a bottom portion and being adapted to provide snap-locking engagement in said corresponding aperture, said top portion engaging and exerting spring pressure on an upper surface of said corresponding aperture while said bottom portion engages and exerts spring pressure on a lower surface of said corresponding aperture; and
- wherein said predetermined configuration of said plurality of pins is adapted for resilient engagement with terminal means of a chip carrier unit which is placed upon said base.

16. The connector of claim 15 wherein said base further comprises a central aperture to facilitate alignment and manufacture of said connector.

17. The connector of claim 16 further comprising an adhesive to seal said apertures.

18. The connector of claim 17 further comprising an integrated circuit chip carrier placed upon said base, wherein a plurality of said pins are electrically connected to said chip through said base for transmitting electrical signals between said chip and an electrical device.

* * * * *